United States Patent
Tang et al.

(10) Patent No.: US 6,621,312 B2
(45) Date of Patent: Sep. 16, 2003

(54) HIGH BANDWIDTH MULTI-PHASE CLOCK SELECTOR WITH CONTINUOUS PHASE OUTPUT

(75) Inventors: Benjamin Tang, Hawthorne, CA (US); Keith Bassett, Torrence, CA (US)

(73) Assignee: Primarion, Inc., Tempe, AZ (US)

( * ) Notice: Subject to any disclaimer, the term of this patent is extended or adjusted under 35 U.S.C. 154(b) by 0 days.

(21) Appl. No.: 10/008,436

(22) Filed: Nov. 13, 2001

(65) Prior Publication Data

US 2002/0056854 A1 May 16, 2002

Related U.S. Application Data

(60) Provisional application No. 60/248,042, filed on Nov. 13, 2000.

(51) Int. Cl.[7] .................................................. H03L 7/06
(52) U.S. Cl. ....................................... 327/156; 327/158
(58) Field of Search .......................... 327/156; 375/376

(56) References Cited

U.S. PATENT DOCUMENTS

| 5,034,967 | A | | 7/1991 | Cox et al. ..................... 375/119 |
|---|---|---|---|---|
| 5,179,303 | A | * | 1/1993 | Searles et al. ............... 327/157 |
| 5,521,499 | A | * | 5/1996 | Goldenberg et al. ........ 327/237 |
| 5,561,692 | A | | 10/1996 | Maitland et al. ............. 375/371 |
| 5,596,610 | A | | 1/1997 | Leung et al. ................. 375/376 |
| 5,602,882 | A | * | 2/1997 | Co et al. ...................... 370/518 |
| 5,614,855 | A | * | 3/1997 | Lee et al. ..................... 327/156 |
| 5,644,604 | A | | 7/1997 | Larson ......................... 375/354 |
| 5,668,495 | A | | 9/1997 | Vora et al. ................... 327/432 |
| 5,717,362 | A | | 2/1998 | Maneatis et al. ............. 331/57 |
| 5,796,792 | A | | 8/1998 | Rokugawa ................... 375/354 |
| 5,815,537 | A | | 9/1998 | Janssen ........................ 375/350 |
| 6,289,068 | B1 | * | 9/2001 | Hassoun et al. ............. 327/156 |
| 6,400,735 | B1 | * | 6/2002 | Percey ......................... 370/518 |

FOREIGN PATENT DOCUMENTS

| EP | 0671633 A2 | 2/1995 |
|---|---|---|
| EP | 0703668 A2 | 8/1995 |
| EP | 0704975 A1 | 9/1995 |
| EP | 1049257 A2 | 9/2000 |
| WO | WO 94/15401 | 12/1993 |

\* cited by examiner

Primary Examiner—David Nelms
Assistant Examiner—Tu-Tu Ho
(74) Attorney, Agent, or Firm—Snell & Wilmer LLP

(57) ABSTRACT

The present invention includes a system and method for improving phase selection using a phase selector system. An exemplary phase selector system of the present invention includes a high speed phase selector having control logic, XOR gates, and a selector. The control logic uses Gray coding to generate one or more control signals. For example, the control logic uses a 3 bit word to select a phase for clock recovery. A selector coupled to the control logic determines the phase selected. XOR gates coupled between the control logic and the selector provide eight phases of a clock using four input phases of the clock with inversion. In this manner, a four to one selector can choose one of eight phases from the XOR gates to aid in clock recovery. The selector control logic has a continuous output phase during a change to an adjacent phase, which substantially prevents glitching on the clock.

20 Claims, 7 Drawing Sheets

| PHASE | C2 | C1 | C0 | X3 | X2 | X1 | X0 |
|---|---|---|---|---|---|---|---|
| 0 | 0 | 0 | 0 | 1 | 0 | 0 | 0 |
| 1 | 0 | 0 | 1 | 1 | 0 | 0 | 0 |
| 2 | 0 | 1 | 1 | 0 | 0 | 0 | 1 |
| 3 | 0 | 1 | 0 | 0 | 0 | 0 | 1 |
| 4 | 1 | 0 | 0 | 0 | 1 | 1 | 1 |
| 5 | 1 | 0 | 1 | 0 | 1 | 1 | 1 |
| 6 | 1 | 1 | 1 | 1 | 1 | 1 | 0 |
| 7 | 1 | 1 | 0 | 1 | 1 | 1 | 0 |

FIGURE 6

HIGH BANDWIDTH MULTI-PHASE CLOCK SELECTOR WITH CONTINUOUS PHASE OUTPUT

RELATED APPLICATIONS

This patent application claims priority to, and the benefit of, the U.S. provisional patent application entitled "HIGH BANDWIDTH MULTI-PHASE CLOCK SELECTOR WITH CONTINUOUS PHASE OUTPUT" filed on Nov. 13, 2000 as U.S. Ser. No. 60/248,042, the entire contents of which is hereby incorporated by reference.

FIELD OF INVENTION

The present invention generally relates to delay lock loop (DLL) devices and clock recovery, and more particularly, to a system and method for using control logic and phase inversion to generate an eight phase selector from a four to one selector.

BACKGROUND OF THE INVENTION

Delay locked loops (DLL) and phase locked loops (PLL) are commonly used to align a particular signal with the same frequency and phase of a reference clock signal. PLL and DLL may be used for various applications such as generating a clean periodic signal from a noisy signal, frequency multiplication, and clock and data recovery. A PLL is an electronic circuit that controls an oscillator, so that the oscillator maintains a constant phase angle relative to a reference signal. Clock recovery circuits typically use a PLL circuit to minimize the phase offset between the clock and data.

The main difference between a PLL and a DLL is that a PLL uses a voltage controlled oscillator (VCO) whose frequency is controlled by the loop, while a DLL uses a variable delay or phase shifter whose delay is controlled by the loop. A VCO is an element where a control voltage varies the output frequency and phase, such that the output is a periodic signal at a desired frequency. The PLL allows the VCO output to be phase locked to an external reference signal. The phase of the VCO output and the reference signal are compared by a phase detector, which generates an output signal indicating whether the VCO output signal is early or late compared to the reference signal. The phase detector output is filtered by a loop filter (e.g., an integrator), which generates a control voltage that controls the frequency of the VCO. As such, the VCO output frequency and phase are adjusted to match the reference frequency and phase.

The basic elements of a DLL include a phase detector, a phase selector, a loop filter, and a variable delay. A DLL is similar to a PLL, but uses a variable delay or phase shifter element instead of a VCO. However, since the delay does not generate a periodic signal directly, an external source to the DLL is usually required. A periodic signal is input to the DLL and delayed by a variable delay or phase shifter to generate a delayed version of the input signal. A reference input is provided at an input port of the phase detector. The DLL output can be phase locked to the reference input, if the periodic input signal is relatively close in frequency to the reference input. The variable delay can be varied in such a way as to ensure that the phase of the output of the DLL substantially tracks the phase of the reference input. The DLL provides the phase tracking mechanism by using a phase detector that compares the relative phase of the DLL output and the reference input to generate a phase detector output that is proportional to the difference in phase. The phase difference is then integrated by an integrator coupled to the phase detector. The integrator generates a control voltage to adjust the delay in the variable delay, essentially trying to zero out the difference in phase between the DLL output and the reference input.

The phase selector of a DLL is discrete, where the phase shift occurs in discrete rather than continuous increments, as in a PLL. One advantage of a discrete phase selector over a continuous phase selector is the ease with which multiple periods of delay can be implemented. This gives the discrete phase selector almost infinite range. A discrete phase selector is typically implemented as a multiplexor, where each input consists of a phase shifted version of the reference clock. However, traditional multiplexors are inadequate for use in high frequency clock recovery due to the high power and limited bandwidth (i.e., where a large number of inputs are required). There is the possibility of glitches or phase discontinuities in the output of traditional multiplexors when the selector control is changed. A system and method for improving clock recovery by simplifying the use of traditional multiplexors in DLLs is desirable.

SUMMARY OF THE INVENTION

The present invention includes a system and method for improving phase selection using a phase selector system. An exemplary embodiment of the present invention includes a high speed phase selector system having control logic using Gray coding to generate at least one control signal. For example, the control logic uses a 3 bit word to select a phase for clock recovery. By using a slightly delayed version of a control signal and selecting adjacent phases for transitioning, smooth phase transitions may be had at the outputs of the high speed phase selector. A selector coupled to the control logic determines the phase selected. XOR gates coupled between the control logic and the selector provide eight phases of a clock using four input phases of the clock with inversion. In this manner, a four to one selector can choose one of eight phases from the XOR gates.

BRIEF DESCRIPTION OF THE DRAWINGS

The subject invention will hereinafter be described in the context of the appended drawing figures, wherein like numerals denote like elements, and:

FIG. 6 illustrates a mapping of the inputs for selecting eight phases in accordance with an exemplary embodiment of the present invention.

DETAILED DESCRIPTION OF EXEMPLARY EMBODIMENTS

The present invention discloses a system and method for using a high-bandwidth phase selector for clock recovery (e.g., determining the correct clock and phase to continuously re-clock a decision circuit flip flop). Many of the exemplary embodiments are illustrated in the context of clock recovery. However, the present invention may be used in virtually any other context using phase selection (e.g., clock multipliers, generation of a clock in a digital chip, alignment of clocks, and/or the like). The present invention incorporates pre-inversion to reduce the number of selection elements and filtered selection control to provide substantially continuous output phase. The present invention takes advantage of several properties. For example, 180 degree phase shifts can be obtained by inverting the clock using an exclusive OR (XOR). The XOR control signal used to invert the clock is easy to generate. It is easy to generate because phase changes are sequential, so that the control signal does not have to change at the same time as the multiplexor. Along with controlled switching of the selector, the clock output can have continuous phase, which virtually eliminates false clocking or clock dropouts when the phase is changed.

Figure 1:
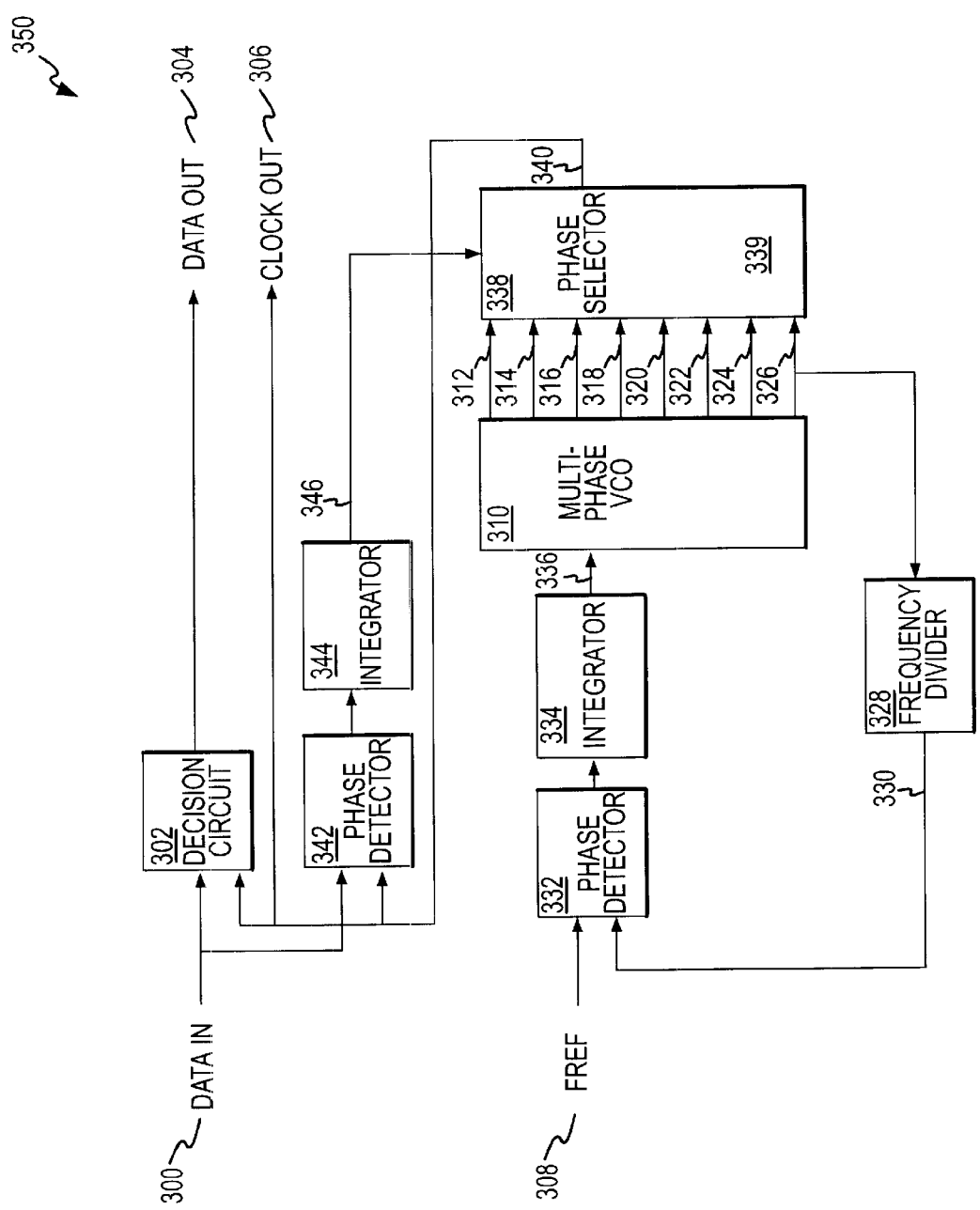
FIG. 1 illustrates a clock and data recovery system in accordance with an exemplary embodiment of the present invention.

FIG. 1 illustrates a clock and data recovery system 350 in accordance with an exemplary embodiment of the present invention. Clock and data recovery system 350 includes a PLL for generating a periodic input to feed into a DLL. The DLL phase locks the periodic input to the data input. Data input 300 is re-clocked by a decision circuit 302 to provide are-clocked data output 304 and a clock output 306. The clock is generated using a PLL to multiply a reference clock 308, which is close to the target data rate divided by a fixed number. An eight phase VCO 310 is used to generate outputs 312, 314, 316, 318, 320, 322, 324, and 326. VCO output 326 is used to drive a frequency divider 328, which generates an output 330 (which is at the VCO frequency divided by a fixed number). Divider output 330 and reference input 308 are compared in a phase detector 332, which drives an integrator 334 to further generate control voltage 336. Control voltage 336 drives VCO 310. In this manner, reference input 308 and frequency divider output 330 are phase locked, and VCO outputs 312 to 326 are at a multiple reference frequency 308.

Outputs 312, 314, 316, 318, 320, 322, 324, and 326 of VCO 310 are used to drive an eight input phase selector 339. Phase selector 339 selects an output phase for signal 340 depending on control word 338. In this manner, phase selector 339 effectively implements a variable delay or phase shift of VCO output 326. Phase selector 339 can select one of eight phases of a clock using four input phases of the clock with inversion. Phase selector 339 output 340 is used to clock the decision circuit 302 and a phase detector 342. Phase detector 342 drives an integrator 344 whose output 346 is used to select the phase of phase selector 339. In this manner, output 340 of the phase selector 339 is phase locked to data input 300, which provides appropriate timing for decision circuit 302 to aid in achieving optimal timing for generating re-clocked data output 304. However, the PLL generates a frequency approximately equal to the required clock frequency. Phase selector 339 control is driven by the DLL, such that the output of phase selector 339 is phase locked to the input data. If the PLL output frequency does not match the data frequency, phase selector 339 controls are changed by the DLL such that it slowly cycles through all the phases. Cycling through the phases adds or deletes an additional period to the output of phase selector 339 over that time, thus changing the frequency of the output of phase selector 339 relative to the PLL output.

Figure 2:
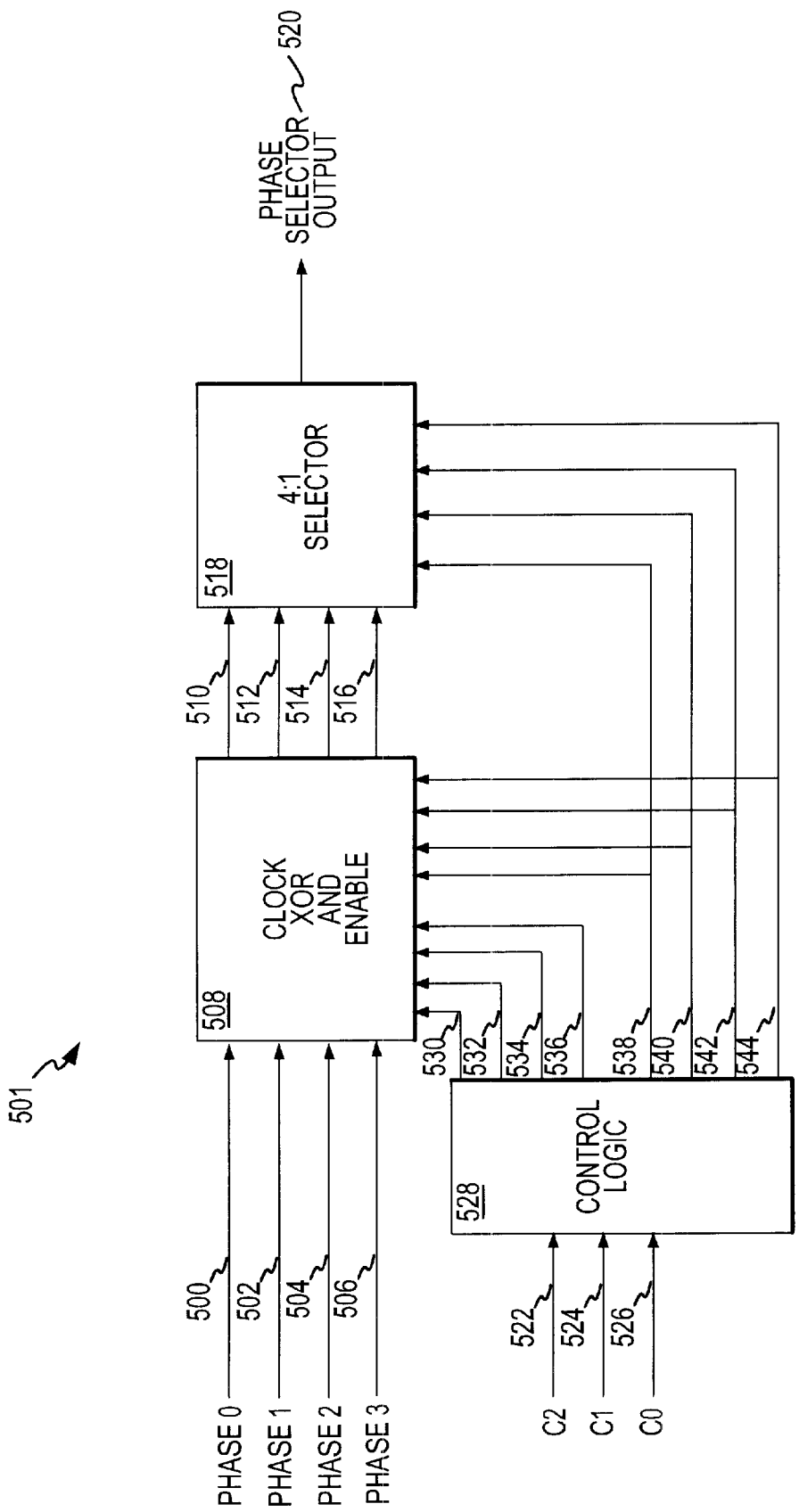
FIG. 2 illustrates a high speed phase selector for selecting one of eight clock phases in accordance with an exemplary embodiment of the present invention.

FIG. 2 illustrates a high speed phase selector 501 for selecting one of eight clock phases to perform clock recovery in accordance with an exemplary embodiment of the present invention. Phase selector 501 includes inputs 500, 502, 504, and 506, where 502 is delayed 45 degrees from 500, 504 is delayed 45 degrees from 502, and 506 is delayed 45 degrees from 504. A set of exclusive OR (XOR) gates 508 is used to invert inputs 500, 502, 504, and 506, if desired, generating four outputs 510, 512, 514, and 516. Outputs 510, 512, 514, and 516 can represent either inputs 500, 502, 504, and 506 or their respective inversions. Each inversion corresponds to a phase shift of 180 degrees from the relevant input. In this manner, all eight phases can be made available at one of outputs 510, 512, 514, and 516 of XOR gates 508.

A four to one selector 518 is used to select one of the four signals from outputs 510, 512, 514, or 516 to drive phase selector output 520. Phase selector output 520 can be selected as any of the eight phases available by selecting the proper input (e.g., inputs 500, 502, 504, or 506, either non-inverted or inverted). The eight phases are selected using a 3 bit control word represented by control bits 522, 524, and 526. Control logic 528 uses Gray coding, for example, to smoothly switch from one phase to another. Gray coding provides sequential transitioning from one phase to the next phase. Gray coding select signals and using two sets of selectors, one of which is slightly delayed and each of which switches a portion of the total current, provides more controlled switching.

Control logic 528 is used to generate the appropriate control signals to XOR gates 508 and four to one selector 518. Control signals 530, 532, 534, and 536 are used to invert the inputs of XOR gates 508 as desired. Control signals 538, 540, 542, and 544 are used to select the appropriate input (e.g., from outputs 510, 512, 514, or 516) to four to one selector 518 and to enable the selected input from XOR gates 508. This allows the unselected outputs of XOR gates 508 to be turned off, minimizing noise and power dissipation. The injection of charge from the other phases is minimized, so the edge speed of phase selector 501 is substantially preserved. This enhances the operational speed of phase selector 501. Thus, phase selector 501 allows for more efficient and faster clock recovery.

Figure 3:
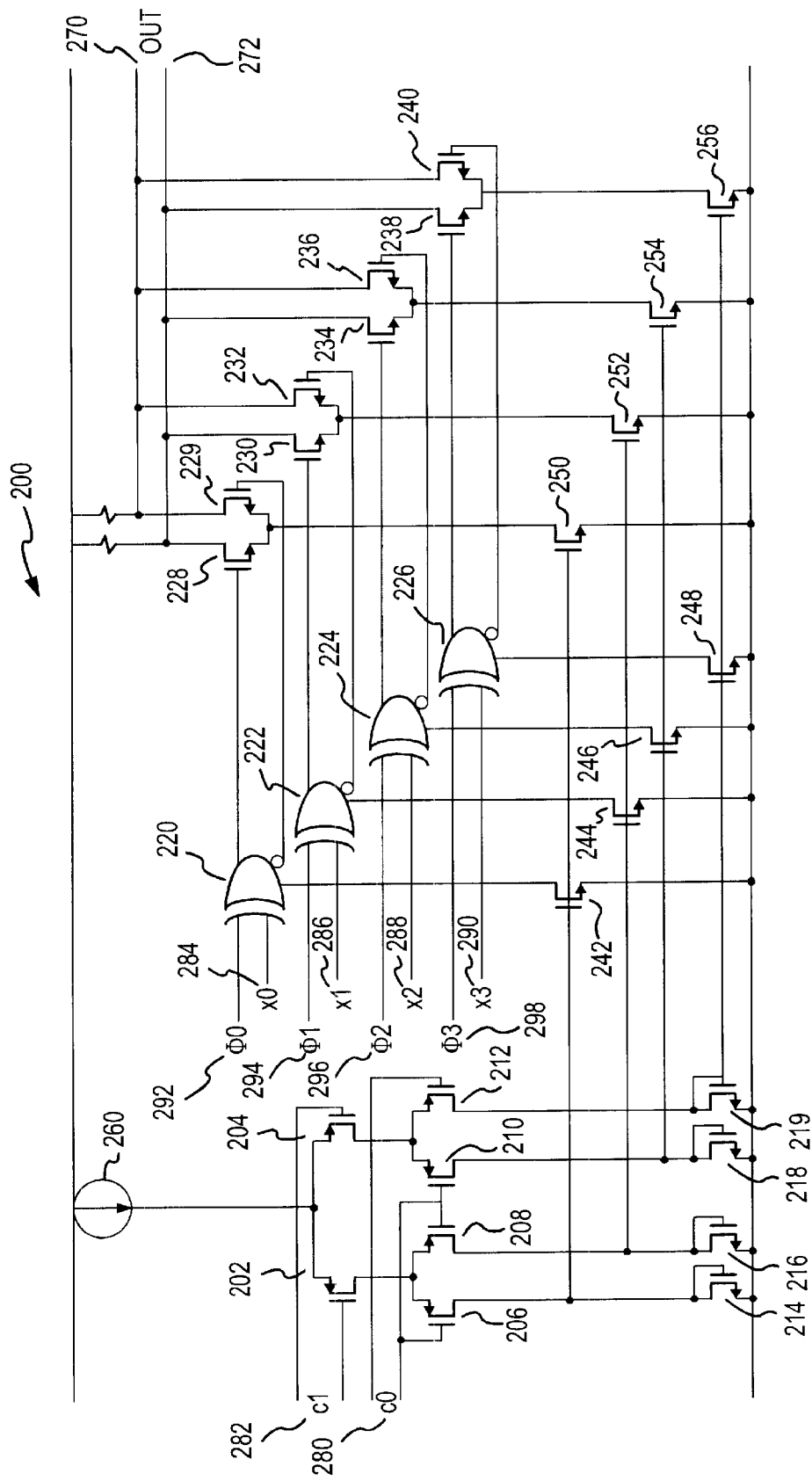
FIG. 3 illustrates a high bandwidth phase selector in accordance with an exemplary embodiment of the present invention.

FIG. 3 illustrates a high bandwidth phase selector 200 in accordance with an exemplary embodiment of the present invention. Phase selector 200 is a more detailed embodiment of phase selector 501 of FIG. 2. Control signal 282 is coupled to transistors 202 and 204 and control signal 280 is coupled to transistors 206, 208, 210, and 212. Transistor 202 is coupled to transistors 206 and 208 and transistor 204 is coupled to transistors 210 and 212.

As explained above, control signals 280 and 282 use Gray coding, so that control signals 280 and 282 do not have to change at the same time. Gray coding select signals (e.g., control signals 280 and 282) and using two sets of select signals, one of which is slightly delayed and each of which switches a portion of the total current from current source 260, provides more controlled switching. Control signal 280 turns on transistors 206, 208, 210, and/or 212. Control signal 282 turns on transistors 202 and/or 204. For example, transistors 202 and 204, 206 and 208, and/or 210 and 212 would be turned on together. Transistors 206, 208, 210, and 212 determine whether transistors 214, 216, 218, and 219 are turned on, respectively. In turn, transistors 214, 216, 218, and 219 determine whether transistors 242, 244, 246, and/or 248 are turned on. Further, transistors 242, 244, 246, and 248 determine whether transistors 250, 252, 254, and/or 256 are turned on. Finally, the outputs of XOR gates 220, 222, 224, and 226 in combination with transistors 250, 252, 254, and 256 determine whether differential pair transistors 228 and 229, 230 and 232, 234 and 236, and/or 238 and 240 are turned on, respectively. This in turn determines the phase selected at output 270. Although not illustrated in FIG. 3, a similar scenario holds for control signal 280 and phase selection at output 272.

Control signals 284, 286, 288, and 290 are individually combined with clock phases 292, 294, 296, and 298, respectively, in XOR gates 220, 222, 224, and 226, respectively. Clock phases 292, 294, 296, and 298 are clocks with the same frequency, but with shifted phase. In this manner, 180 degree phase shifts can be obtained by simply inverting each clock. For example, phases 0, 1, 2, and 3 can be inverted to produce phases 4, 5, 6, and 7, respectively. As such, four input phases with XOR gates can provide eight output phases. In the past, eight paths were needed to produce an eight phase system. By implementing XOR gates 220, 222, 224, and 226 and using inversion, four phases can be used to generate eight phases.

Figure 4:
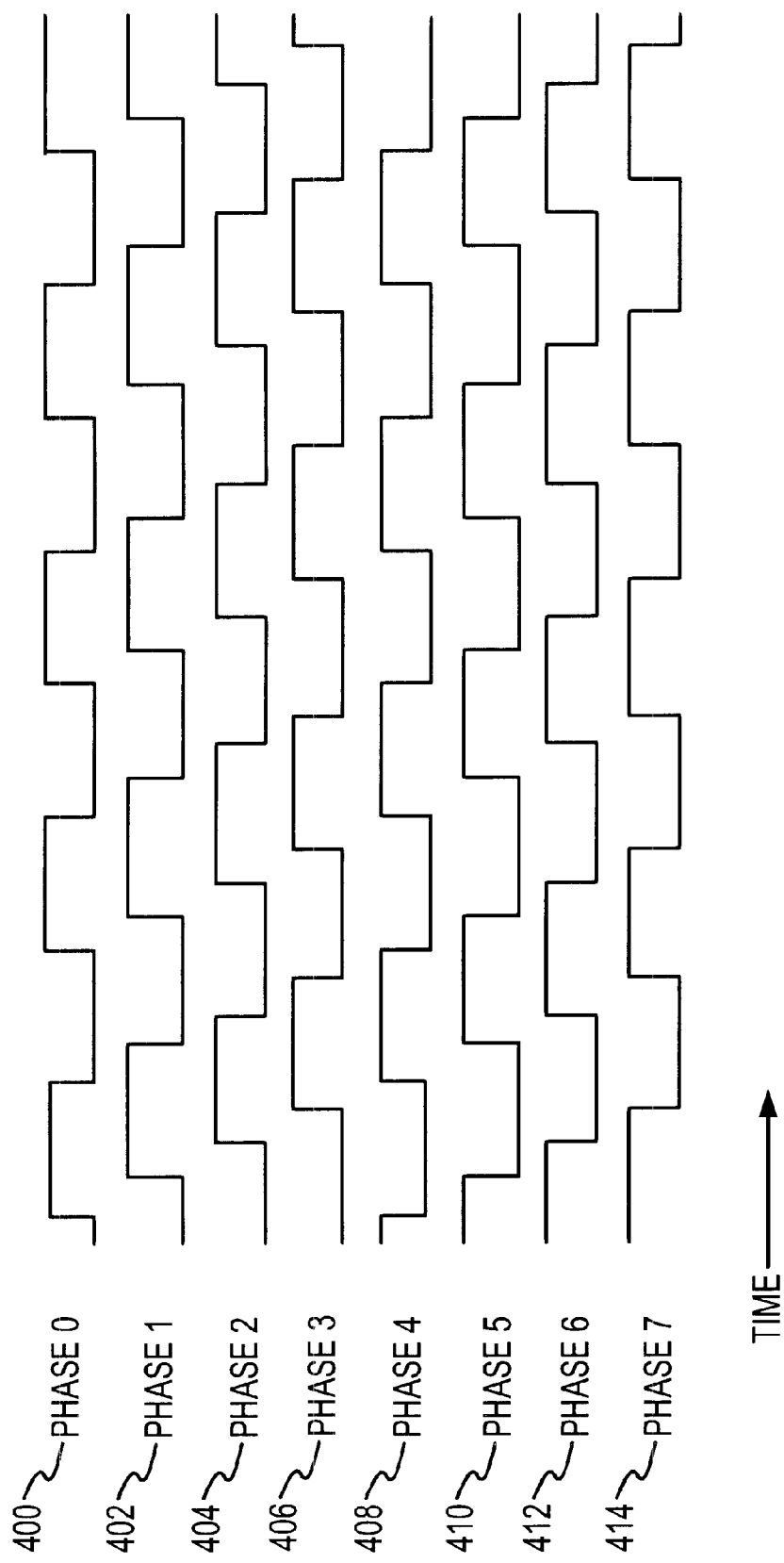
FIG. 4 illustrates a timing diagram illustrating the phase relationship of the outputs of a multi-phase system and the inputs to a phase selector in accordance with an exemplary embodiment of the present invention.

FIG. 4 is a timing diagram illustrating the phase relationship of the outputs of a multi-phase system (e.g., phase selector 200, phase selector 501, or the like) and the inputs to a phase selector (e.g., four to one selector 518) in accordance with an exemplary embodiment of the present invention. The eight waveforms 400, 402, 404, 406, 408, 410, 412, and 414 are all at the same frequency, but are slightly delayed from each other, such that they correspond to a phase shift of 45 degrees relative to each other. Any other amount of a phase shift can be used, where 45 degree phase shifts are illustrated here. 360 degrees constitutes a full period. Waveforms 408, 410, 412, and 414 are equivalent to the logical inversions of waveforms 400, 402, 404, and 406, respectively. To illustrate a phase change from phase 0 to phase 1, control signal 280 would turn on transistor 206, which turns on transistor 214. Transistor 214 turns on transistor 242, which turns on transistor 250. The output of XOR gate 220 and differential pair transistors 228 and 229 produce a phase between phase 0 and phase 1. Usually, transistors 242 and 250 are turned on for about one clock cycle or an amount of time which allows the current in transistors 242 and 250 to settle to about 90% of their final current amount. Of course, any amount of time and any percentage of settling current can be used depending on the needs of phase selector 200. Once transistors 242 and 250 have been on for an amount of time, then they are turned off. Once transistors 242 and 250 are turned off, a phase change from 0 to 1 occurs. As such, phase selector 200 provides a substantially smooth transition between phases 0 and 1. Similar transitions for other phases are possible.

The non-inverting output of XOR gate 220 is transmitted to differential pair transistor 228 and the inverting output of XOR gate 220 is transmitted to differential pair transistor 229. In a similar manner, XOR gate 222 is coupled to differential pair transistors 230 and 232; XOR gate 224 is coupled to differential pair transistors 234 and 236; and XOR gate 226 is coupled to differential pair transistors 238 and 240. Through the use of control signals 284, 286, 288, and 290, an output can be obtained from XOR gates 220, 222, 224, and 226. Each output from XOR gates 220, 222, 224, and 226 is either substantially identical to the clock phase input into the XOR gate or substantially inverted to the clock phase input into the XOR gate (in the latter case, e.g., shifted 180 degrees from the input clock phase).

The output of high bandwidth phase selector 200 is available at outputs 270 and 272. Output 270 is coupled to transistors 229, 232, 236, and 240. Output 272 is coupled to transistors 228, 230, 234, and 238. Outputs 270 and 272 of phase selector 200 provide a method for determining whether phase selector 200 has proper timing, so that clock recovery may be performed as desired. For example, output 270 and/or 272 may output (e.g., to an integrator (not shown)) whether phase selector 200 has early or late clock cycles with respect to a reference clock. The integrator or other element may then feedback this information to phase selector 200 for clock recovery as desired.

Figure 5:
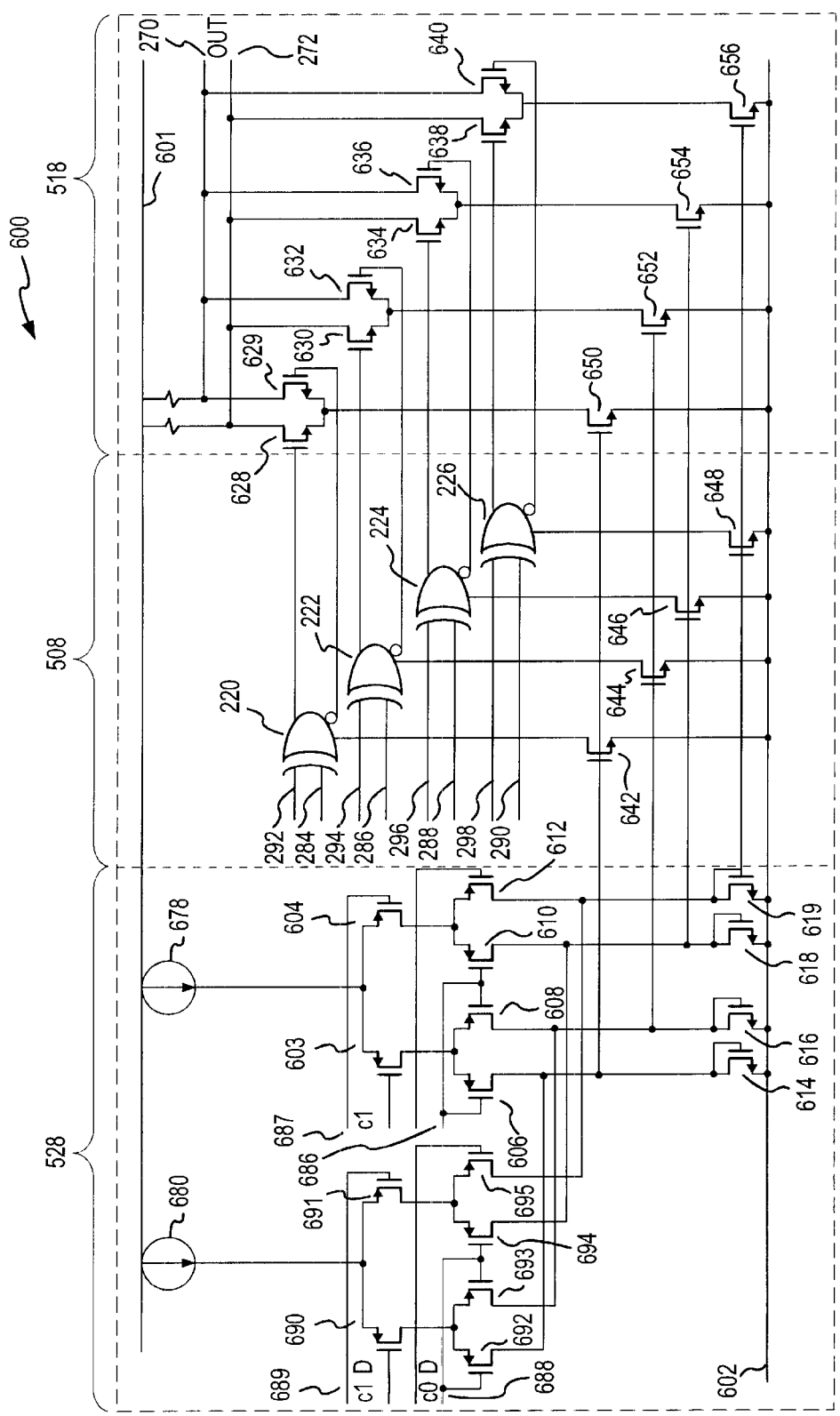
FIG. 5 illustrates a high speed phase selector in accordance with an exemplary embodiment of the present invention.

FIG. 5 illustrates a high speed phase selector 600 in accordance with an exemplary embodiment of the present invention. Phase selector 600 behaves similar to phase selector 501 of FIG. 2 and phase selector 200 of FIG. 3. For example, one exemplary embodiment of each of control logic 528, XOR gates 508, and four to one selector 518 is illustrated in FIG. 5. Power is supplied by Vdd at port 601 and by ground at port 602. Four to one selector 518 is controlled via differential input ports 686, 687, 688, and 689. Ports 686 and 687 steer current from source 678 into one of devices 614, 616, 618, and 619, which mirror the current into devices 642, 644, 646, 648, 650, 652, 654, and 656. Similarly, ports 688 and 689 steer current from source 680 into devices 614, 616, 618, and 619. This effectively produces a current sum controlled by the two sets of inputs (ports 686 and 687 and ports 688 and 689). By using a slightly delayed version of control signals 686 and 687 at ports 688 and 689 and selecting adjacent phases for the inputs 658, 660, 662, and 664, smooth phase transitions may be had at outputs 270 and 272 as the control inputs (ports 686, 687, 688, and/or 689) are changed. For example, the slight delay could be as short as possible, but longer than the time for switching from one phase to the next phase. In this way, the slight delay could be for a fixed amount of time based on the time it takes to switch from one phase to the next phase. Control logic 528 provides a portion of the enabling current to four to one selector 518 such that the switching of the selected phase occurs in a substantially smooth manner. A portion of the enabling current may include about one-half of the enabling current, for example, or any other suitable amount of enabling current depending on the needs of high speed phase selector 600.

Four clock phases are supplied at inputs 292, 294, 296, and 298. Control ports 284, 286, 288, and 290 are used to invert selected phases through XOR gates 220, 222, 224, and 226. XOR gates 220, 222, 224, and 226 are enabled through transistors 642, 644, 646, and 648. XOR gates 220, 222, 224, and 226 generate differential outputs that drive differential pairs 628 and 629, 630 and 632, 634 and 636, and 638 and 640, generating the selector output at nodes 270 and 272. The appropriate input is selected by transistors 650, 652, 654, and 656. Combining these control inputs with the XOR controls (e.g., inputs 284, 286, 288, and 290) allows all eight phases to be selected by four to one selector 518.

FIG. 6 illustrates a mapping of the inputs for selecting the eight phases in accordance with an exemplary embodiment of the present invention. Inputs 292, 294, 296, and 298 correspond to phases 0, 1, 2, and 3, respectively (where phases 4, 5, 6, and 7 are the logical inversions of phases 0, 1, 2, and 3, respectively). The eight phases are mapped into gray coded C2, C1, and C0. Ports 686 and 687 are connected to C1 and C0 and ports 688 and 689 are delayed versions of C1 and C0. Control signals 284, 286, 288, and 290 are connected to X0, X1, X2, and X3. For example, X3, X2, X1, and X0 are generated from C2, C1, and C0 according to the following logical expressions: X3=C2 XNOR C1; X2=C1; X1=C1; and X0=C2 XOR C1, where XNOR is an exclusive not (or inverted) OR and XOR is an exclusive OR.

In one example, when the output is to select phase 0, input 292, C1, and C0 will be zero. This steers current through transistor 214 and enables XOR gate 220 through transistor 242, which further enables differential pair transistors 228 and 229 through transistor 250. X0 will be 0, so that XOR gate 220 does not invert and the output passes phase 0. At the same time, X3 will be 1 and X1 will be 0. There may now be a switch to phase 1 available at input 294. C1 will be 0, C0 will change to 1, which steers current from transistor 214 to transistor 216. This disables XOR gate 220 and enables XOR gate 222, which further disables differential pair transistors 228 and 229 while enabling differential pair transistors 230 and 232. X1 remains at 0, so the output phase now passes phase 1. X0 remains at 0 and X2 is also 0, so that neither needs to be changed if the phase is changed from 1 to 0 or 1 to 2. Similarly, when switching to phase 2, C1 will be 1, C0 will be 1, and the current will be steered from transistor 216 to transistor 218. This enables XOR gate 224 and differential pair transistors 234 and 236, and passes phase 2. X2 and X1 remain at 0 and X3 changes to a 0, so that the phase may now be changed from 2 to 1 or from 2 to 3 without requiring changes in X1 or X3, respectively. In this manner, as phases are switched from one phase to a neighboring phase, only one affected control input changes at a time.

Figure 7:
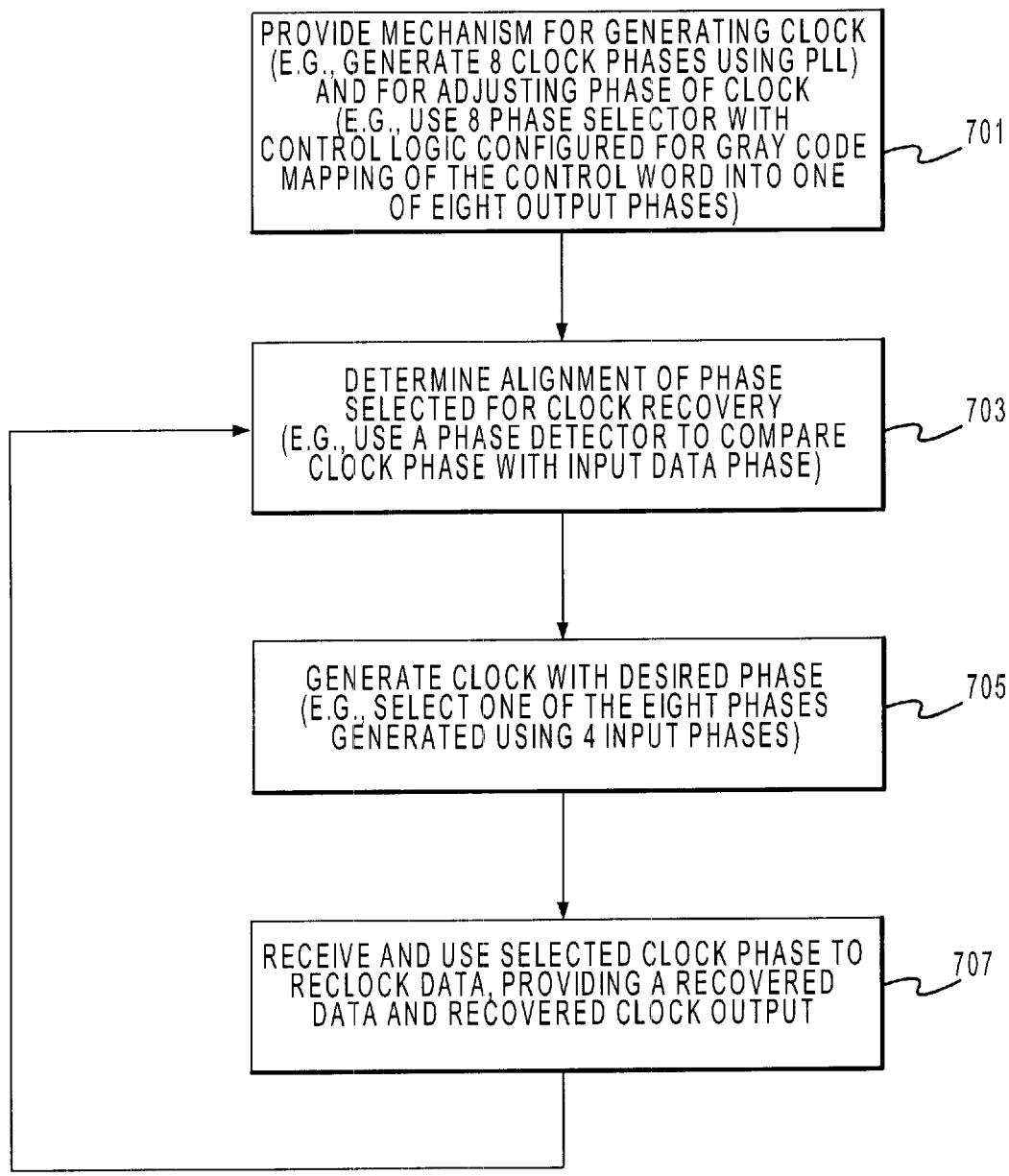
FIG. 7 is a flowchart illustrating a method for selecting the phase in clock recovery in accordance with an exemplary embodiment of the present invention.

FIG. 7 illustrates a flowchart for a method for selecting the phase in clock recovery in accordance with an exemplary embodiment of the present invention. Selecting the phase for clock recovery includes providing a mechanism for generating a clock (e.g., generating eight clock phases using a PLL) and for adjusting the phase of the clock (e.g., using an eight phase selector with control logic configured for Gray code mapping of the control word into one of eight output phases) (step 701). For example, a control signal may be received from the control logic to determine the phase selected for clock recovery. In the example in FIG. 6, port 686 (C0) is a logical zero and input 292 is phase 0. The control signal and the phase selector generate the selected phase for the phase selector in order to perform clock recovery.

The phase for clock recovery may be determined via a phase selector coupled to the control logic. The alignment of the phase selected may be determined for clock recovery (e.g., using a phase detector to compare the clock phase with the input data phase) (step 703). A PLL generates a multi-phase clock at a multiple of a reference frequency. For example, first, second, third, and fourth XOR gates may be used for receiving the selected phase from the control logic and outputting the selected phase to the phase selector. Control signal 290 turns on XOR gate 226, which along with transistors 648 and 656 turn on differential pair 638 and 640. The phase selector may be configured for receiving the selected phase from at least one of the first, second, third, and fourth XOR gates in order to perform clock recovery. Four input phases of the clock may be used to generate eight phases of a clock using inversion. The desired phase of the clock may be generated (e.g., selecting one of the eight phases generated using four input phases) (step 705). The phase selector outputs a phase (e.g., phase 0). Turning on differential pair 638 and 640 selects phase 0 at output 272. In this example, phase 0 is selected at output 272.

Finally, the phase selector may receive the selected phase from the control logic in order to perform clock recovery. The selected clock phase may be received and used to re-clock data, providing recovered data and a recovered clock output (step 707). For example, clock recovery may involve a phase selector, phase detector, and phase integrator system. A phase detector compares phase 0 to the data. If the data is early, the phase integrator is decremented. If the data is late, the phase integrator incremented. The phase integrator output is sub-sampled (i.e., further determination as to whether to increment or decrement). After N number of cycles, the phase selector control is updated depending on the phase integrator output. N can be any number depending on the needs of the system. The output of the phase integrator is decoded to generate the appropriate control signals (e.g., C2, C1, C0, X3, X2, X1, X0). If there is no change in the phase integrator output, the phase remains the same. If there is a change in the phase integrator output, the phase integrator sampling period will continue at an adjacent phase. The method continues by further determining whether to increment or decrement in determining the phase selected for clock recovery (step 703).

Thus, the present invention provides methods and apparatus for more efficiently performing clock recovery using a phase selector. Control logic using Gray coding generates at least one control signal for clock recovery. A selector receives the control signal from the control logic to determine the phase selected for clock recovery. XOR gates communicating with the control logic and the selector can provide eight phases of a clock using four input phases of the clock with inversion. The selector selects the appropriate input from the XOR gates. This allows the unselected outputs of the XOR gates to be turned off, which minimizes noise and power dissipation and enhances the operational speed of the phase selector.

The present invention may be described herein in terms of functional block components, screen shots, optional selections and various processing steps. It should be appreciated that such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, the software elements of the present invention may be implemented with any programming or scripting language such as Basic, C, C++, Java, COBOL, assembler, PERL, extensible Markup Language (XML), with the various algorithms being implemented with any combination of data structures, objects, processes, routines or other programming elements. Further, it should be noted that the present invention may employ any number of conventional techniques for data transmission, signaling, data processing, network control, and the like. Still further, the invention could be used to validate data with a user-side scripting language, such as JavaScript, VBScript or the like.

As will be appreciated by one of ordinary skill in the art, the present invention may be embodied as a method, a data processing system, a device for data processing, and/or a computer program product. Furthermore, aspects of the present invention may take the form of a computer program product on a computer-readable storage medium having computer-readable program code means embodied in the storage medium. Any suitable computer-readable storage medium may be utilized, including hard disks, CD-ROM, optical storage devices, magnetic storage devices, and/or the like.

It should be appreciated that the particular implementations shown and described herein are illustrative of the invention and its best mode and are not intended to otherwise limit the scope of the present invention in any way. Indeed, for the sake of brevity, conventional data networking, application development and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical electronic transaction system.

In the foregoing specification, the invention has been described with reference to specific embodiments. However, it will be appreciated that various modifications and changes can be made without departing from the scope of the present invention as set forth in the claims below. The specification and figures are to be regarded in an illustrative manner, rather than a restrictive one, and all such modifications are intended to be included within the scope of present invention. Accordingly, the scope of the invention should be determined by the appended claims and their legal equivalents, rather than by the examples given above. For example, the steps recited in any of the method or process claims may be executed in any order and are not limited to the order presented in the claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical".

What is claimed is:

1. A high speed phase selector system, comprising:
   control logic using Gray coding for generating at least one control signal for phase selection;
   a selector having multiple inputs coupled to the control logic, wherein the multiple inputs correspond to multiple phases of a high frequency periodic waveform clock for determining the phase selected, and
   a plurality of XOR gates coupled between the control logic and the multiple inputs of the selector for providing additional phases to the selector using logic inversion of the multiple inputs.

2. The high speed phase selector system of claim 1, wherein the selector determines the phase selected by aligning the clock with data used in clock recovery.

3. A high speed phase selector system, comprising:
   control logic using Gray coding to generate a control signal consisting of a binary word;
   a selector coupled to the control logic for receiving the control signal to determine the phase selected, and
   four XOR gates coupled between the control logic and the selector for providing eight phases of a clock using four input phases of the clock with inversion.

4. The phase selector system of claim 3, wherein one XOR gate is turned on indicating the selected phase and the remaining XOR gates are turned off.

5. A phase selector system, comprising:
   four XOR gates having four input phases where each XOR gate is configured to output one of two input phases using inversion; and
   a four to one selector coupled to the outputs of the four XOR gates for selecting a phase from the outputs of the four XOR gates.

6. A phase selector system, comprising:
   control logic for selecting a phase;
   first, second, third, and fourth XOR gates having the control logic coupled to the inputs of the first, second, third, and fourth XOR gates, wherein the control logic selects a phase and inputs the selected phase to the inputs of the first, second, third, and fourth XOR gates; and
   a four to one selector coupled to the outputs of the first, second, third, and fourth XOR gates for receiving the selected phase from at least one of the outputs of the first, second, third, and fourth XOR gates.

7. The phase selector system of claim 6, wherein the control logic uses Gray coding and is coupled to the inputs of the first, second, third, and fourth XOR gates via one or more transistors.

8. The phase selector system of claim 6, wherein the four to one selector includes a differential pair of transistors coupled between each output of the first, second, third, and fourth XOR gates and the output of the phase selector system.

9. The phase selector system of claim 6, wherein:
   the control logic uses Gray coding and is coupled to the inputs of the first, second, third, and fourth XOR gates via one or more transistors; and
   the four to one selector includes a differential pair of transistors coupled between each output of the first, second, third, and fourth XOR gates and the output of the phase selector system.

10. A phase selector, comprising:
    control logic for generating at least one control signal and configuring multiple sets of control logic, wherein each set includes control words delayed by a fixed amount; and
    a selector coupled to the control logic for receiving the at least one control signal to determine the phase selected, wherein the control logic provides a portion of the enabling current to the selector such that the switching of the selected phase occurs in a substantially smooth manner.

11. A clock recovery system used in delay locked loops, comprising:
    a high speed phase selector including control logic using Gray coding to generate at least one control signal and a selector coupled to the control logic for receiving the at least one control signal to determine the phase selected;
    a phase detector coupled to the high speed phase selector for detecting the phase selected; and
    an integrator coupled to the high speed phase selector and the phase detector for receiving the phase detected and performing clock recovery.

12. A method for selecting a phase in a delay locked loop, comprising the steps of:
    configuring control logic to use Gray coding to select one or more phases;

generating eight phases of a clock using four input phases of the clock with XOR inversion, configuring the phase selector for receiving the selected phase from the control logic in order to perform clock recovery, and determining the selected phase via the delay locked loop coupled to the control logic in order to select the output phase of a phase selector.

13. The method of claim 12, further comprising the steps of:

receiving at least one control signal from the control logic to determine the phase selected for clock recovery; and using the control signal to generate the selected phase for the phase selector in order to perform clock recovery.

14. The method of claim 12, further comprising the steps of:

using first, second, third, and fourth XOR gates for receiving the selected phase from the control logic and outputting the selected phase to the phase selector; and configuring the phase selector for receiving the selected phase from at least one of the first, second, third, and fourth XOR gates in order to perform clock recovery.

15. A method for selecting the phase in a phase selector system, comprising the steps of:

configuring multiple sets of control logic, wherein each set includes control words delayed by a fixed amount to select one or more phases;

generating eight phases of a clock using the multiple sets of control logic and four input phases of the clock with inversion;

selecting the phase via a phase selector coupled to the control logic, and providing a portion of the enabling current to the selector such that the switching of the selected phase occurs in a substantially smooth manner.

16. The method of claim 15, further comprising the steps of:

using first, second, third, and fourth XOR gates for receiving the selected phase from the control logic and outputting the selected phase to the phase selector; and configuring the phase selector for receiving the selected phase from at least one of the first, second, third, and fourth XOR gates in order to perform clock recovery.

17. The method of claim 16, further comprising the step of configuring control logic to use Gray coding to select one or more phases.

18. The method of claim, 15, further comprising the step of configuring control logic to use Gray coding to select one or more phases.

19. The method of claim 15, wherein a portion of the enabling current is about one-half of the enabling current.

20. A phase selector, comprising:

control logic for generating at least one control signal and configuring multiple sets of control logic, wherein each set includes control words delayed by a fixed amount;

a selector having multiple inputs coupled to the control logic for receiving the at least one control signal to determine the phase selected, and a plurality of XOR gates coupled between the control logic and the multiple inputs of the selector for providing additional phases to the selector using logic inversion of the multiple inputs, wherein the control logic provides a portion of the enabling current to the selector such that the switching of the selected phase occurs in a substantially smooth manner.

* * * * *